US008780110B2

(12) United States Patent
Ben Himane et al.

(10) Patent No.: US 8,780,110 B2
(45) Date of Patent: Jul. 15, 2014

(54) COMPUTER VISION CAD MODEL (71) Applicant: MVTEC Software GmbH, Munich (DE)

(72) Inventors: Selim Ben Himane, Munich (DE); Stefan Hinterstoisser, Munich (DE); Nassir Navab, Munich (DE)

(73) Assignee: MVTEC Software GmbH, Munich (DE)

( * ) Notice: Subject to any disclaimer, the term of this patent is extended or adjusted under 35 U.S.C. 154(b) by 0 days.

(21) Appl. No.: 13/845,946

(22) Filed: Mar. 18, 2013

(65) Prior Publication Data

US 2013/0226532 A1    Aug. 29, 2013

Related U.S. Application Data

(63) Continuation of application No. 12/682,199, filed as application No. PCT/EP2008/063640 on Oct. 10, 2008, now abandoned.

(51) Int. Cl.
*G06T 15/00* (2011.01)
*G09G 5/00* (2006.01)
*G06K 9/62* (2006.01)
*G05B 13/02* (2006.01)
*G06F 15/18* (2006.01)
*G06E 1/00* (2006.01)

(52) U.S. Cl.
USPC ........... 345/419; 345/581; 345/619; 382/159; 382/209; 382/224; 700/29; 700/47; 706/12; 706/20

(58) Field of Classification Search
USPC .................. 345/419, 581, 582, 619; 382/103, 382/155–160, 181, 190, 195, 199, 201, 203, 382/205, 209, 224–228; 700/28–31, 47, 48; 706/12–16, 20, 21
See application file for complete search history.

(56) References Cited

U.S. PATENT DOCUMENTS

| | | | |
|---|---|---|---|
| 5,963,653 A | 10/1999 | McNary et al. | |
| 2004/0096107 A1 | 5/2004 | Ii et al. | |
| 2005/0212797 A1 | 9/2005 | Lee et al. | |
| 2006/0013450 A1 | 1/2006 | Shan et al. | |
| 2006/0204107 A1 | 9/2006 | Dugan et al. | |
| 2007/0258645 A1 | 11/2007 | Gokturk et al. | |
| 2008/0089579 A1* | 4/2008 | Han et al. | 382/159 |
| 2009/0033655 A1 | 2/2009 | Boca et al. | |

OTHER PUBLICATIONS

Shin, Andrew, Dec. 17, 2012, "Final Rejection for related case U.S. Appl. No. 12/682,199", USPTO, pp. 1-23.*
Kyrki, V. et al., "Tracking unobservable rotations by cue integration," in Proc. IEEE International Conf. on Robotics and Automation, ICRA 2006, vol. 2006, pp. 2744-2750, 2006.
"Object (computer science)" from Wikipedia, dated Aug. 31, 2007, printed Sep. 29, 2010.
Taylor, G. et al., "Fusion of multimodal visual cues for model-based object tracking," in Australasian Conf. on Robotics and Automation, Brisbane, Australia, pp. 108, Dec. 2003.

* cited by examiner

*Primary Examiner* — Wesner Sajous
*Assistant Examiner* — Andrew Shin
(74) *Attorney, Agent, or Firm* — Kagan Binder, PLLC (57) ABSTRACT

The CV-CAD (computer vision-computer-aided design) model is an enhanced CAD (computer-aided design) model that integrates local and global computer vision data in order to represent an object not only geometrically but also in terms of computer vision. The CV-CAD model provides a scalable solution for intelligent and automatic object recognition, tracking and augmentation based on generic models of objects.

10 Claims, 5 Drawing Sheets

GENERAL DESCRIPTION OF THE CV-CAD MODEL

▲ projected 2D points
● original 3D points
◉ image 2D points

COMPUTER VISION CAD MODEL

CROSS REFERENCE TO RELATED APPLICATIONS

This application is a continuation application of U.S. application Ser. No. 12/682,199 filed Jun. 25, 2010, which is a 371 application of PCT/EP08/63640 filed Oct. 10, 2008, which claims priority to EP application 07020041.5 filed Oct. 12, 2007, the entire disclosures of which are incorporated herein.

BACKGROUND OF THE INVENTION

Despite the strong research advances in computer vision and pattern recognition of the last decades, marker-less vision-based applications are rare in industrial environments. This is mainly due to the expensive engineering step needed for their integration into an existing industrial workflow. Typically, an expert decides which algorithm is most suited for each specific application. The decision is generally based on not only the geometry and the appearance of the object to be recognized by the application, but also the illumination conditions and the optical sensor (the camera and the lens) that are used.

For example, when the object is piecewise planar and textured, the expert may select methods based on feature point detection and/or template-based tracking to recognize the object in a single image or an image sequence. He manually tests different visual feature detectors and descriptors, and then selects the method that provides the optimum recognition results for the object. When tracking should also be performed, he typically also needs to choose the planar polygons in the CAD model to consider in the template-based tracking. The problem is that the result of such an engineering step typically cannot be used for other objects, for example, if the industrial object is not piecewise planar and not well textured.

Consequently, most of the engineering steps are not general and cannot be easily adapted to new applications. In fact, they are often only valid for limited object categories, restricted viewpoints (even within the same category of objects), special illumination conditions or camera resolutions and lenses. Therefore, in practice, once one of these parameters changes, the engineering step must be performed again.

There are already many computer vision methods available that are working on 2D structures and perform a feature matching. One such method is the "scale-invariant feature transform" (SIFT) detector and descriptor [1]. A version modified towards speed is the "speeded up robust features" (SURF) method [2]. Certain other descriptors based on classification were also published, like randomized trees [3], randomized ferns [4], and a boosting method [5]. Closer to the concept of agents, which is explained below, are the feature detectors like the "Harris affine" or "Hessian affine" detectors [8], "intensity-based regions" (IBR) [9], "edge-based regions" (EBR) [9], "maximally stable extremal regions" (MSER) [10], "salient regions" [11] and others, which where summarized and evaluated in [6]. Although they don't provide matching methods, they give an approximate transformation as soon as a matching has been established. Another type of features is edges. Edge features are more difficult to handle, but also some methods have been published [7], [11]. Contrary to the approach of the present invention, all these algorithms are not incorporated into CAD models and don't make use of the additionally available geometric data.

SUMMARY OF THE INVENTION

It is an objective of this invention to provide enhanced CAD models, called computer vision CAD models (CV-CAD models), that can be used in vision-based applications by integrating computer vision methods into the CAD models. This objective is achieved with the features of the claims.

The computer vision methods are integrated in the CAD models in the same way as textures are currently integrated in the CAD models. However, in this case, each part of the model, in addition to the file containing the texture and the geometric description, will have a file, which is generated automatically by training, that describes which method should be used in every computer vision application condition to optimally recognize this part of the model.

Additionally, a tool that allows the creation of a CV-CAD model from the standard CAD model of the object and at least one image of that object is proposed. The only requirement is that the image or images of the object are registered to the CAD model. These data are processed and as a result, additional information is enclosed in the standard 3D model, which allows the direct integration of vision-based applications. The combination of geometric data and computer vision data is done by agents, which can operate locally or globally and can generate pose hypotheses and confidence values.

The CV-CAD models are extended CAD models that can be used for any vision-based application that has as output the pose of the object observed by the camera, e.g., robot control, autonomous vehicle driving, augmented reality, special effects, or industrial inspection.

Thus, according to a first aspect, the invention provides a method for creating a computer vision CAD model for use in object recognition or pose estimation from a standard CAD model of an object, the computer vision CAD model containing one or more agents that can be used for recognizing the object or parts of the object, said agents being attached to said object or to said parts of the object, comprising the steps of: a) training said agents from the geometry of the object and the surface texture of the object, and b) storing said agents in the computer vision CAD model.

The agents preferably comprise data that is used by object recognition or pose estimation algorithms that are defined outside the computer vision CAD model itself. It is also preferred that the agents comprise executable object recognition or pose estimation algorithms including data required for the object recognition or pose estimation algorithms. The surface texture of the object is preferably stored in the standard CAD model. Alternatively, the surface texture of the object is preferably obtained from one or more images of the object, additionally including the step of registering said one or more images of the object with the standard CAD model.

Training the agents preferably comprises selecting the best set of features and computer vision method to use for the object recognition or pose estimation. In addition, geometric neighborhood relations and visibility information between the agents may be trained. The agents preferably are removable, addable, or replaceable by other agents if parts of the object are removed, added, or replaced. The agents are preferably selected from any of the following agents: point feature agent, edge-based agent, contour-based agent. In the following, some preferred embodiments illustrating these three types of agent will be described. However, other possible types of agents such as color-based agents can be considered.

According to a second aspect, the invention provides a method for using a computer vision CAD model for object recognition or pose estimation, the computer vision CAD model containing one or more agents that can be used for recognizing the object or parts of the object, said agents being attached to said object or to said parts of the object, comprising the steps of: a) receiving the computer vision CAD model file, b) generating executable instances of the agents that are stored in the computer vision CAD model file, c) receiving an image, d) recognizing the object described in the computer vision CAD model file or estimating its pose in said image by executing the agents, and e) returning the object identity or its pose as well as the confidence of the object identity or pose.

In this method, it is preferred that each agent returns hypotheses about the possible identity or pose of an object or object part. According to a further preferred embodiment, a plurality of agents is used and the agents communicate with each other about possible object identities or pose hypotheses and confidence values of said possible object identities or said pose hypotheses.

The agents preferably select the best set of features and computer vision method to use for the object recognition or pose estimation with respect to said possible object identities, said pose hypotheses, geometric relationships, and an indication of visibility derived from the geometric relationships.

It is also preferred that the agents collaborate to derive a consistent hypothesis for the object identity or pose of the entire object stored in the computer vision CAD model.

In accordance with the first aspect, the invention also provides a computer vision system comprising a computer vision CAD model for use in object recognition or pose estimation from a standard CAD model of an object, the computer vision CAD model containing one or more agents that can be used for recognizing the object or parts of the object, said agents being attached to said object or to said parts of the object, said system comprising means for training said agents from the geometry of the object and the surface texture of the object, and means for storing said agents in the computer vision CAD model.

In accordance with the second aspect, the invention also provides a computer vision system comprising a computer vision CAD model for object recognition or pose estimation, the computer vision CAD model containing one or more agents that can be used for recognizing the object or parts of the object, said agents being attached to said object or to said parts of the object, said system comprising: means for receiving the computer vision CAD model file, means for generating executable instances of the agents that are stored in the computer vision CAD model file, means for receiving an image, means for recognizing the object described in the computer vision CAD model file or estimating its pose in said image by executing the agents, and means for returning the object identity or its pose as well as the confidence of the object identity or pose.

In summary, the invention provides the following features or advantages:

The CV-CAD model concept is an extension of the standard CAD models.

The CV-CAD model can be used in every vision-based application that has as output the recognition and/or pose estimation of the object observed by the camera The CV-CAD model encapsulates agents that permit to select at every step of the vision-based application the best computer vision method to use.

The agents of the CV-CAD model of a given object are (local) visual entities that are capable of recognizing parts of the object or the entire object.

The agents of the CV-CAD model of a given object are trained from the CAD model and a collection of calibrated images of the object or from the already textured CAD model.

The agents of the CV-CAD model combine the geometric information contained in the CAD model of a given object and the visual information contained in a set of images of that object or the existing texture of the object.

The agents of the CV-CAD model are automatically generated using a combination of visual features, such as points, corners, segments, lines, edges, color, texture, contours, and the like.

Every agent of the CV-CAD model (locally) contributes to achieve precise recognition and pose estimation results.

The agents of the CV-CAD model are structured hierarchically and every agent contains information concerning all the other (neighboring) agents.

The agents of the CV-CAD model (locally) interact with each other to achieve optimum recognition times, optimum recognition performance, and optimum pose accuracy.

The agents are described with all their necessary data within the CV-CAD file(s).

In an application that uses a CV-CAD model, the CV-CAD model is loaded and, for each agent described in the CV-CAD, a separate program/thread is automatically instantiated and executed to perform object recognition and pose estimation.

DESCRIPTION OF THE PREFERRED EMBODIMENTS OF THE INVENTION

In the first step, a CAD model of an object must be textured. For instance, this can be done by registering images of the object with the CAD model, e.g., with the method described in [18]. If a textured CAD model is already available, the first step does not need to be performed. In a second step, for each part of the textured CAD model the optimal computer vision features are trained. Optimal means that the computer vision features extracted and computed for the single parts are the most robust and stable features for object recognition and pose estimation. In the training step, different other aspects of computer vision, like, e.g., self-occlusion of the object, different lighting conditions, appearance and viewpoint changes of the object parts, etc., can be considered as well.

Computer vision features can be split into detectors, like points, corners, segments, lines, edge profiles, colors, texture, contours, and the like, and descriptors, like SIFT, Randomized Trees, SURF, edge profile, contour shape, statistical color distribution, curvatures, moments, and the like. All of the above features and other features that are not listed above can be used by the invention.

In a preferred embodiment, in order to have simple and efficient solutions, the invention especially considers minimum sets of local visual features that form a detectable 3D entity that facilitates object pose estimation relative to one or more cameras. These entities are also called Natural 3D Marker (N3Ms), contrary to artificial markers: an N3M is defined as a minimal subset of features that is able to give pose hypotheses and confidence values. In addition to the set of optimal computer vision features that represent a single object part, the geometric relation between different parts of the object and their optimum visual features sets are trained.

During runtime, the CV-CAD model is loaded once and each computer vision feature included in the model provides a method to detect itself. After receiving an image from the camera, the different computer vision features act like agents that communicate with each other about possible pose hypotheses and confidences about their pose estimates. They share their information with each other to come to one final pose estimate solution. Since the single features are attached only to single parts of the object, the possibility of changing parts of the object by attaching additional parts or removing them does not decrease the performance of object recognition significantly.

Description of Some Preferred Embodiments of Agents

In the following, some exemplary embodiments of agents are given that can be integrated into a CV-CAD model. Apart from them, every suitable computer vision method could be reengineered to act as an agent. Therefore, the description of the preferred embodiments of the agents should be regarded as merely illustrative rather than in a limiting sense.

Point Feature Agent

In the following, one embodiment of CAD-based natural 3D markers (N3Ms) is described. The description is split into a training and a runtime phase. The training phase starts with the preprocessing phase. In the preprocessing phase, first all the feature points that can be detected under multiple viewpoints, illumination changes, and noise are trained. Harris corner points [13] are known to have a good mixture between illumination invariance, fast computation, and invariance to large viewpoint changes [14]. Note that other point detectors could also be used. In order to select the most stable points for object recognition and pose estimation, the textured 3D model of the object is synthetically rendered under different random transformations, noise is added to it, and Harris corner points are extracted. Since the transformations are known, for each physical point the repeatability of extraction can be computed. A set of points with high repeatability is temporarily selected for further processing. The next preprocessing step consists in ensuring the equal distribution of the feature points. If all feature points were clustered in one region, the detection would not be possible as soon as this region becomes occluded. Therefore, it has to be ensured, as far as possible, that the feature points are equally distributed over the surface of the object. A tradeoff between the equal distribution and the repeatability should be considered. Since every object can be approximated as piecewise planar, it is made sure that the number of the points extracted on each plane is proportional to the ratio between the area of the plane and the overall surface area of the object. This does not avoid having clustered point clouds in one specific part of a plane, but ensures that the points are evenly distributed among the different planes of the object. In the final preprocessing step a visibility set for each 3D feature point is computed. A visibility set contains all viewpoints from which the 3D feature point is visible. For this reason, an approximated triangulated sphere around the object is defined, where each triangle vertex stands for one specific viewpoint, and shoot rays from these viewpoints to each 3D feature point. If a ray from a certain viewpoint intersects the object on the 3D feature point first, this viewpoint is inserted into the visibility set of the 3D feature point.

Figure 1:
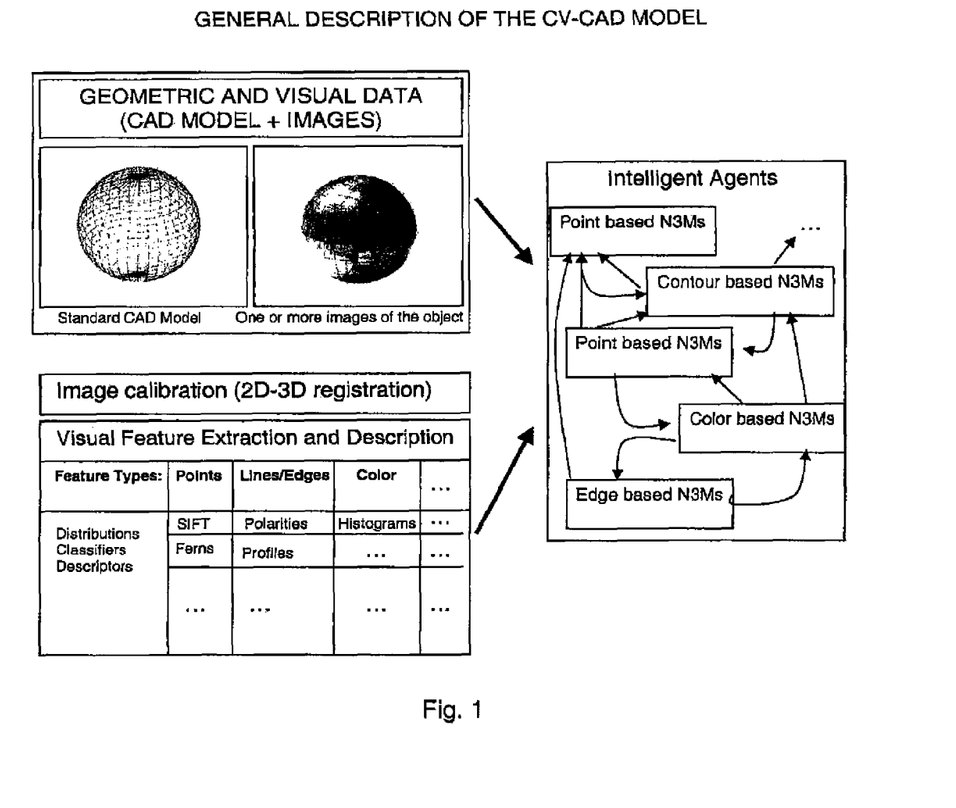
FIG. 1 is an illustration of the CV-CAD model.
Figure 2:
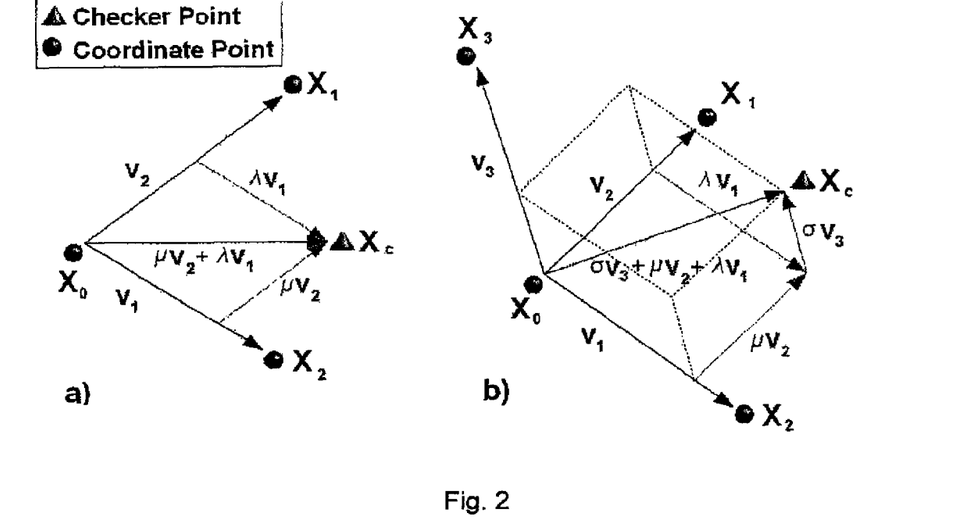
FIG. 2 shows a possible N3M on a planar surface (a) and on a non-planar surface (b).

Next, it is explained how the point-based N3Ms are trained. An N3M is a set of 3D coordinate points that define a local coordinate system and one 3D check point expressed in this local coordinate system that permits to check the N3M's point configuration for geometric consistency. Consequently, two possible cases are distinguished: planar (defined with 3 coordinate points) and non-planar (defined with 4 coordinate points) N3Ms. See FIG. 2 for an illustration. The first step consists of creating all potential N3Ms. Since an N3M only contributes to detection and pose estimation if all its points are extracted and correctly matched, the points should be located in the same local neighborhood. This increases the probability that an N3M is also detected under self-occlusion or partial occlusion of the object. The algorithm as shown in algorithm 1 is used in order to create all potential N3Ms.

Algorithm 1 Calculate set G of all Potential N3Ms

Figure 3:
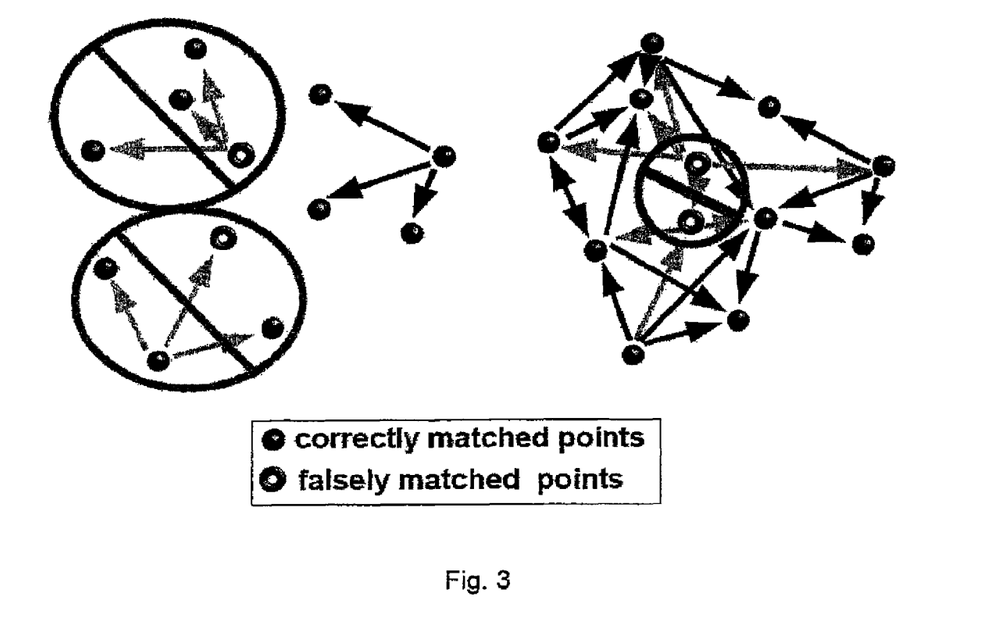
FIG. 3 displays the robustness because of connectivity between N3Ms.
Figure 4:
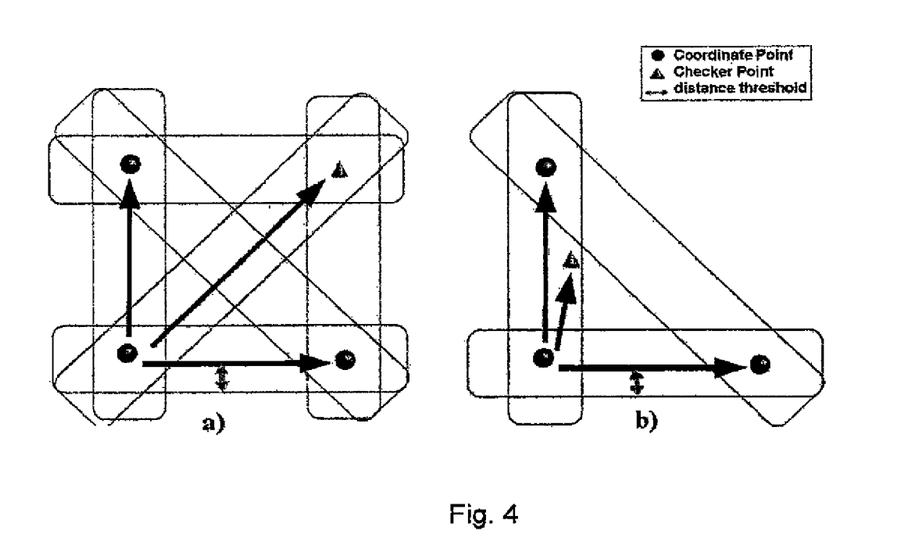
FIG. 4 shows a non-degenerate (a) and a degenerate N3M (b).

Require: extracted feature points $X_i$
$G \leftarrow \{\}$
For all $X_i$ do
    Create all possible quadruplets $Q_{ik}$ including $X_i$ in a local neighborhood of $X_i$
    For all $Q_{ik}$ do
        If the points of $Q_{ik}$ are all on the same plane then
            1. $S_{ik} \leftarrow Q_{ik}$
            2. label an arbitrary point of $S_{ik}$ checker point
        else
            1. $S_{ik} \leftarrow Q_{ik} \cup \{X_j\}$, where $X_j$ is another neighbor
            2. label $X_j$ as checker point
        end if
        if the intersection of the visibility set of the feature points forming $S_{ik}$ is not the empty set then
            $G \leftarrow G \cup \{S_{ik}\}$
        end if
    end for
end for Note that this algorithm allows that one feature point belongs to multiple N3Ms. This is called connectivity. If the N3Ms were constructed in such a way that one feature point belonged to a single N3M, the rest of the feature points of that N3M could not be used as soon as one feature point of an N3M is not extracted or badly matched. With connectivity, the probability that a correctly matched feature point belongs to at least one N3M for which all other feature points are also correctly matched is therefore increased. An example for connectivity is shown in FIG. 3. All ill-conditioned N3Ms are then removed. It is known that point configurations that are close to collinear or located in a very small neighborhood lead to unstable detection and pose estimation results. In order to exclude these cases, a tube-collinearity test is applied. Three points are tube collinear if one of these three points is located within a tube of radius $d_t$ whose axis is the line connecting the two other points. See FIG. 4 for an illustration. To remove all N3Ms that are close to degenerate point configurations, all N3Ms excluded that contain tube-collinear points. For this purpose, a quality value for every N3M is computed by using the following formula:

$$\prod_{i,j}\left(1-\exp\left(-\frac{1}{2}\left(\frac{d_{ij}}{d_i}\right)^2\right)\right)$$

Here, $d_{ij}$ denotes the distance of the i-th point from the j-th line formed by two other points of the N3M. This quality measure is normalized between 0 (ill-conditioned) and 1 (well conditioned). The N3Ms with a quality value below a certain threshold are discarded. Since each formed set obtained by this algorithm is both local and well-conditioned, it can theoretically be used for stable pose estimation of the object once it has been detected. The final training step consists of training a point classifier for the feature points that form one or more N3Ms. The randomized trees [3] are chosen for the reasons explained above. Note that other classifiers can also be used. In addition, for each N3M $X_i: i \in \{0,1,2,3,c\}$, the 3D coordinate system origin $X_0$, the local coordinate axes $V_i = X_i - X_0 : i \in \{1,2,3\}$, and the coordinates $(\lambda, \sigma, \delta)$ of the check point $X_c$ expressed in the local coordinate system $\{X_0, V_0 V_2, V_3\}$: $X_c = X_0 + \lambda V_1 + \sigma V_2 + \delta V_3$ are stored. In case of planar N3Ms, $X_3$ and $V_3$ do not exist and s=0.

During the runtime, in each acquired image the feature points are extracted and the preliminary one-to-one 2D-3D correspondences are obtained using the point classifier. Only points participating in forming complete N3Ms are considered in the matching. The other feature points are discarded. In order to remove falsely matched points and to compute the pose, a two-step algorithm is used.

Figure 5:
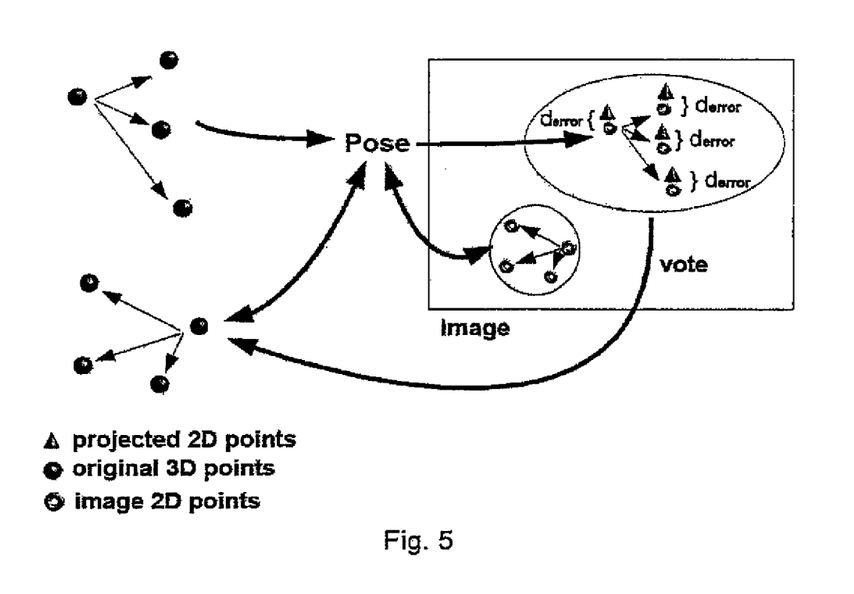
FIG. 5 shows the final voting scheme for N3Ms.

The first step consists of the self-verification of the N3Ms. Each N3M can be self-verified independently of other N3Ms. In fact, given the relative position of the check point with respect to the local coordinate points, a score function is introduced that determines whether a subset of points of the N3M is correctly matched or not. Let $v_i: i \in \{1,2,3\}$ be the real 2D coordinate axes, $x_0$ the real coordinate origin, and $x_c$ the real check point after projection into the image. Since the N3Ms are local, every projection matrix P can be approximated by a linear fronto-parallel projection matrix A that preserves parallelism. Thus, we have $x_c = PX_c$.about.$AX_c = x_0 + \lambda v_1 + \sigma v_2 + \delta v_3$. Now let $v_i: i \in \{1,2,3\}$ be the 2D coordinate axes and $x_0$ and $x_c$ be the coordinate origin and the check point as detected in the image. The score function $f = \|x_c - x_0 - \lambda x_1 - \sigma x_2 - \delta x_3\|$ returns a low score for a correctly matched N3M and a high score if one of the feature points is falsely matched. The proposed score function is similar to Geometric Hashing [15]. It permits to remove most of the falsely matched N3Ms. Some very special configurations remain and need the second step of the algorithm to be automatically removed. Given the high percentage of correctly matched N3Ms after the first step, the incorrectly matched N3Ms are excluded by using the following voting scheme: if the pose provided by one N3M is confirmed (or voted for) by a certain number of other N3Ms, the correspondences of this N3M are added to the set of correspondences for global pose estimation. Experimentally, it has been found that the voting by two other N3Ms is enough to ensure robust detection and accurate pose estimation. The voting process is shown in FIG. 5. Alternatively, for planar N3Ms, one could also compute a similarity measure (e.g., NCC) between the area of the current image enclosed by the 2D feature points and the texture of the model enclosed by the corresponding N3M. Due to the non-degenerate point configurations of an N3M, the similarity measure can easily be computed after mapping the current image area to the corresponding model texture. This similarity-based voting enables an N3M to be totally verified by itself alone and therefore serves as an independent natural 3D marker. The whole runtime algorithm is summarized in algorithm 2.

Algorithm 2: Calculate the Pose of an Object with N3Ms

Require: trained Natural 3D Markers $N3M_i$
$S \leftarrow \{\}, F \leftarrow \{\}$
Extract the feature points $X_i$ in the current image
For all Xi do
    Classify $X_i$ and establish 2D-3D correspondences
End for
For all $N3M_i$ do
    If $N3M_i$ has its member points matched do
        If $f_s(N3M_i) < t_s$ then
            $S \leftarrow S \cup \{N3M_i\}$
        end if
    end if
end for
for all $N3M_i$ in S do
    if m-N3Ms of S vote for $N3M_i$ or $NCC(N3M_i)$ is high then
        $F \leftarrow F \cup \{N3M_i\}$
    end if
end for
compute the final pose with all points of all $N3M_i$ in F Edge-Based Agent In the following, an edge-based agent is described whose matching structure uses the principles set forth in [7] and [17]. In the first step, different robust local agents consisting of discriminative edge structures are trained. For this, a procedure similar to [16] is used: first, different views of the textured CAD model are generated synthetically, perform edge detection, project each edge pixel back to 3D using the geometry stored in the CAD model, remove 3D edge points whose robustness to illumination and visibility is low, merge all remaining 3D points back to a contour using the Euclidean minimum spanning tree, and finally approximate the contour with B-splines, lines, or similar approximations. Then, discriminative local groups of edge pixels are built. For this, the different groups of edges are compared under different views and ambiguous edge structures that are similar under a certain percentage of the investigated number of views are removed. For each remaining local edge group (which is a natural 3D marker again), different templates (for different views) are built on different scales to allow a hierarchical and therefore faster matching. Since the number of templates for one marker determines the runtime of its detection, each marker is represented by as few templates as possible. For this, as many different views as possible are grouped together if the shapes of the markers under different views are similar. For the similarity measurement, the formula of [7] is used, i.e., the mean sum of the normalized dot products between a template gradient and an image gradient is computed, which is occlusion and illumination invariant. For perspective distortions, furthermore clusters of edge pixels are built like in [17] that help to ease the process of matching perspectively warped markers.

During runtime, for an incoming image the search is started on the coarsest scale by comparing the different templates of a marker with the edge map of the image. Since the similarity measure of [7] allows skipping the search efficiently if a certain image position does not generate the minimal similarity, we are able to efficiently generate first hypotheses of marker occurrences within the image. All hypotheses that exceed a certain threshold are followed down the scale pyramid. While going down the pyramid, a coarse-to-fine approach is applied by using templates of the marker that handle increasingly finer motions. A marker is established if its similarity measure on the lowest pyramid level is still higher than a certain threshold.

Contour-Based Agent In the following a closed-contour-based agent is described. In many industrial applications, man-made objects often have only little texture but many homogenous regions framed by strong edges. In these cases, it is difficult to use texture-based agents. Therefore, a contour-based agent is presented that is working with the shapes of closed contours, which occur quite often in these kinds of objects. In the first step, all discriminative shapes of the object are trained by warping the textured object synthetically with random transformations. For each rendered transformation of the object, the Canny edge detector is computed on the image and the distance map is computed with respect to the edges extracted with the Canny detector. The next step consists of extracting the shape of closed contours from the distance map. In order to deal with small gaps in the contour line, the shapes are defined as the contour line built by pixels with the same distance value. To extract the shapes in a very robust manner with respect to perspective changes, the contour line are not defined with pixels of a certain absolute value, but with the relative distance values of the pixels with respect to a local maximum. Therefore, the algorithm is started at points that have no other point in their local neighborhood whose distance value is bigger than theirs and use them as seed points for shape extraction.

Since these seed points are sorted according to their distance value in descending order and the algorithm is started with the largest seed point, it is avoided to define the relative distance map of a certain shape with a seed point that is not largest within this shape since a index map is used that tells if a shape was already defined by a seed point with higher distance value or not. If the shape was already defined (which is known if the index map has an according entry in the index map) the extracted contour is removed.

Figure 6:
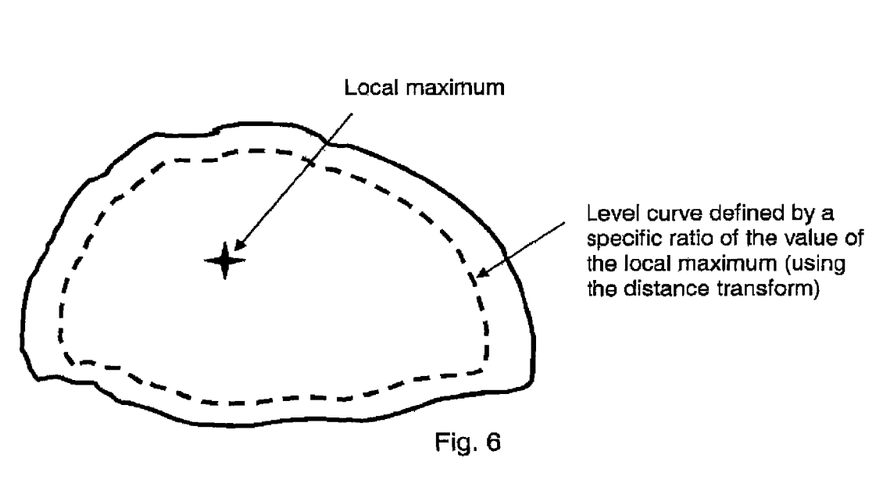
FIG. 6 shows the extraction of the contour of the shape with a relative distance map.

The contour for a certain shape is now computed by taking all the pixels around one seed point that have a certain relative value within the range of (0 . . . 1) with respect to the maximal value of the seed point (see FIG. 6).

Figure 7:
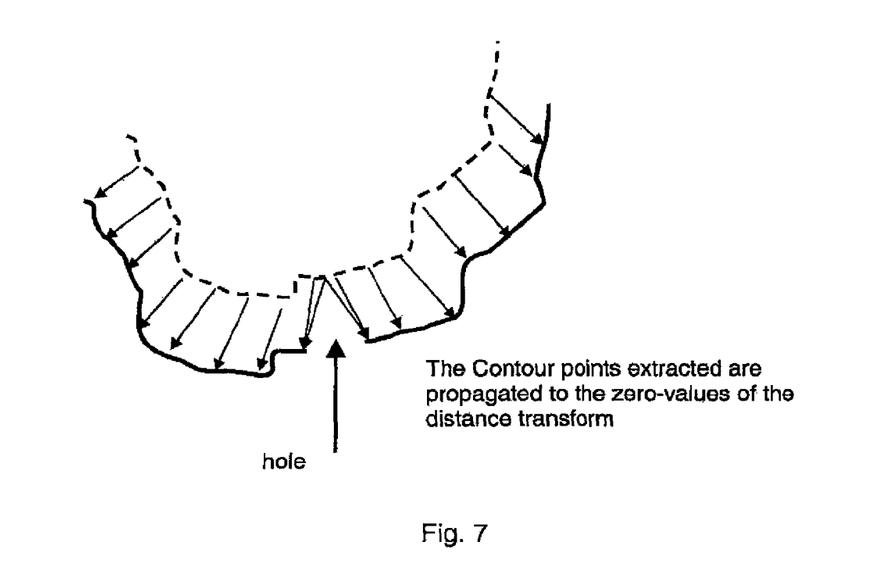
FIG. 7 shows the propagation of the contour line to the edge (with holes in the edge).

The contour defined by the curve points is now very robust to perspective distortions. In order to get more accurate results, these curve points are propagated to the zero-valued points (which are the edges extracted with the Canny edge detector; since these points define a shape and the shape is forced to be closed but is also able to stretch, holes are still closed here; see FIG. 7).

Figure 8:
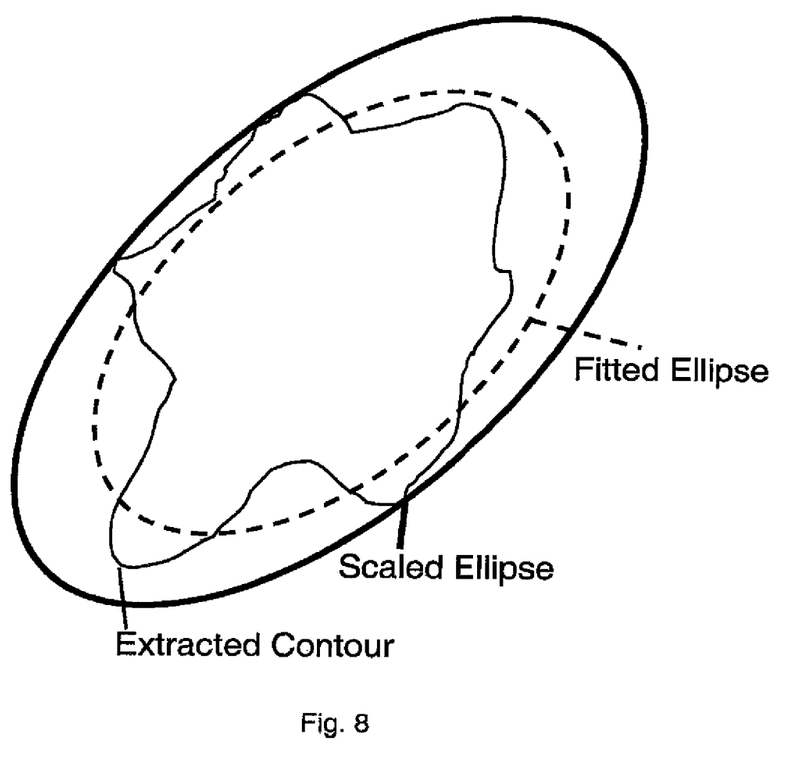
FIG. 8 shows the linear least squares fitting of an ellipse to the contour and its scaling.

The next step is to compute the ellipse that fits best (in a least-squares sense) to the set of 2D contour points and to scale it up until all contour points are included (see FIG. 8). Now, a transformation $T_1$ is calculated that rotates the main axis of the ellipse to be equal to the x-axis and that normalizes the size of the ellipse to be equal to a certain circle with a fixed radius.

This transformation is applied onto the distance map around the midpoint of the extracted ellipse. Thus, for each closed contour of a shape a fixed-size patch is obtained. These patches are taken and a fern [4] is trained. Since ferns need only simple comparisons, they are very robust against the missing invariance of distance maps to perspective transformations. For robustness, for each shape two different classes are created: one class with the shape itself and one with a version of the shape rotated by 180 degrees around the ellipse centre. Furthermore, all the shapes are merged that have their origin from the same physical structure as long as they do not have a totally different representation due to perspective distortions or self-occlusion.

During runtime, the same patch extraction method as described for the training part is applied and the extracted patches are classified with the trained ferns. Since there are still many outliers, in this step a self-verification method is applied that removes many outliers. The self-verification step starts by projecting the known normalized shape with the approximated rough transformation $T_1$ into the current image. Now the energy function is computed that is basically a sum of squared distance differences that is necessary to go from the projected shape to the closest contour line within the image (i.e., points that have 0 distance value). This can be done quite efficiently since the computed distance map of the current image is already available and only the squared distance map values of the current position to which the single shape points are projected have to be summed. This registration method is done iteratively until each shape point is assigned to a certain contour line point and the energy function is minimal. Thus, each closed shape already gives a rough local approximation of the current transformation. Since shape patches are not as discriminative as textured patches, there are still some outliers left after the self-verification phase. Therefore, a voting scheme is added similar to the one of the point-based agents (see FIG. 5). Each self-verified shape checks whether the neighboring shapes are identified as expected with respect to the pose computed. Normally, two to three self-verified shapes in a local neighborhood are enough to establish a correct matching. Finally, the method directly returns a pose hypothesis and a confidence value that is related to the energy functions of the matched entities.

Description of the Preferred Embodiments of the Agent Communication

In order to get the final pose of the object in the current image, the agents must communicate with each other and share pose hypothesis and confidence values about the computed poses. This is necessary since the computed poses are mainly local and therefore only rough approximations of the real pose. In order to do so, the agents must know their relative position to each other and the visibility of the agents under different rough poses. The relative position is given in 3D coordinates (X,Y,Z). The local poses are given by a 3D rotation matrix R and a 3D translation vector T. To compute the visibility of the different agents, a sphere is constructed around the object and divided into different coarse viewing sectors. Given an agent and its position on the object, rays are emitted from the agent position to every direction. The sectors that intersect with the emitted rays before the ray hits the object are taken as the sectors under which the agent is detectable.

Given an agent A with a certain pose hypothesis, the pose hypothesis is first converted into one of the viewing sectors. The viewing sector directly returns a sorting criterion in which order the other agents should be checked to verify the pose hypothesis of agent A and to refine it (the agents are sorted according to their closeness to the viewing sector that is related to the pose hypothesis of agent A). If several agents give pose hypotheses at the same time, the corresponding confidence values influence the sorting according to how confident the agents are about their computed pose. The more confident agents therefore have a higher influence on the order in which the agents are investigated. If they are equally confident, they vote for the viewing sector they believe they are in and the viewing sector with the most votes is taken first.

For simplicity, let the agent that delivers the pose hypothesis with the highest confidence value be denoted as "agent A". Then, the first agent from the sorted list of agents (sorted according to the pose hypothesis of agent A) is taken (this agent is called "agent B"), its relative position to agent A is projected into the current image with the pose hypothesis of agent A and the neighborhood of this projected location is investigated to find an occurrence of agent B. If agent B can confirm the pose hypothesis of agent A (i.e., if agent B is detected at the predicted position), the pose hypothesis is refined by taking into account the output of both agents A and B, and their common confidence value is increased. If the pose hypothesis cannot be confirmed, the second from the sorted list of agents is taken (this agent is called "agent C") to confirm the pose hypothesis of agent A. At the same time, the confidence value of the agent A is decreased. This procedure is continued with all the agents from the list until the confidence value of agent A is lower than the confidence value of one of the other agents (this agent is called "agent X"). If the confidence value of agent A is lower than the confidence value of agent X, the procedure is continued with agent X delivering the main pose hypothesis. In order to avoid checking the relation of two agents several times although they are not consistent with each other, a relation list is created in which it is listed whether the relationship between two agents could be consistently established or not. If not, this relation is not further investigated. If the confidence value of one common pose exceeds a certain threshold, this pose hypothesis is taken as the final global pose under which the object is seen in the current image.

Description of Possible Embodiments of the CV-CAD Format

The CV-CAD model is a combination of a conventional CAD model and a description of computer vision methods and their characteristics that describe the model or parts of the model in computer vision terms. Although each CAD model format is easily extensible to a CV-CAD model format, by way of an example, we extend the Wave Front OBJ file model with computer vision data. It should be noted that the extension can be done in different ways to the embodiment described here. Therefore, the description here is merely illustrative rather than limiting. To those skilled in the art, it will be readily apparent how other CAD file formats can be extended in ways that fall within the scope and spirit of this invention.

Each computer vision method is instantiated through local agents that contain all necessary data and parameters for their independent use. Thus, each agent is represented, e.g., by its location(s), by its set of parameters, by its computer vision method, by its (training) data, by its relation to other agents, by its confidence about its generated pose hypotheses, by its knowledge under which given poses (given, e.g., by other agents) it is able to give reliable pose hypotheses, by its knowledge about the reflective character of the local surface of the object, and by its knowledge about the geometric neighborhood of the object (including possible (local) self-occlusion).

One embodiment is that each vertex in the CAD model is automatically an agent. Another embodiment is that only the most representative markers serve as agents. In the latter case, computer vision is performed all over the object and not only on the vertices. Each object location that is used for computer vision is represented by the vertex indices of the surrounding polygon and the barycentric coordinates in terms of the surrounding polygon. To those skilled in the art, it will be readily apparent that both approaches can be combined, too.

Each agent is treated similar to a certain material, as defined by the Wave Front OBJ file format. Thus, for each agent we have a file in which all necessary parameters and data are described in order to allow the agent to perform object recognition and pose estimation. Analogously to the "mtllib" OBJ file entry, we suggest "agtlib *.agt" to be the key word for an agent file "*.agt". The agent file itself has the file extension "*.agt". Since the invention allows computer vision methods that work on each instance of a certain pattern (and thus on repeatable patterns), the invention allows one agent to be placed into different places of the object (thus avoiding redundancy). Analogously to the "usemtl" OBJ file entry, the tag "useagt *.agt local" is used to indicate that the agent "*.agt" is placed within the first polygon that follows the tag. The exact position of the agent is specified in the "*.agt" file. If an agent is operating globally, it is using the tag "useagt *.agt global". The following polygon is not considered.

The different parameters and data tags within the "*.agt" file are chosen with respect to the computer vision method used within an agent.

LIST OF REFERENCES

[1] D. G. Lowe: Method and apparatus for identifying scale invariant features in an image and use of same for locating an object in an image; U.S. Pat. No. 6,711,293.
[2] H. Bay, T. Tuytelaars, L. Van Gool: SURF: Speeded Up Robust Features; in: 9th European Conference on Computer Vision, Ale{hacek over (s)} Leonardis, Horst Bischof,
Axel Pinz (Editors), Lecture Notes in Computer Science, Volume 3951, Springer Verlag (2006), 404-417.
[3] V. Lepetit, P. Lagger, P. Fua: Randomized Trees for Real-Time Keypoint Recognition; in: Computer Vision and Pattern Recognition (2005).
[4] M. Ozuysal, P. Fua, V. Lepetit. Fast Keypoint Recognition in Ten Lines of Code; in: Computer Vision and Pattern Recognition (2007).
[5] M. Grabner, H. Grabner, H. Bischof: Learning Features for Tracking; in: Computer Vision and Pattern Recognition (2007).
[6] K. Mikolajczyk, T. Tuytelaars, C. Schmid, A. Zisserman, J. Matas, F. Schaffalitzky, T.
Kadir, and L. Van Gool. A Comparison of Affine Region Detectors; in: International Journal of Computer Vision, 65(1):43-72, 2005.
[7] Carsten Steger: Similarity Measures for Occlusion, Clutter, and Illumination Invariant Object Recognition; in: Pattern Recognition, Bernd Radig, Stefan Florczyk (Editors), Lecture Notes in Computer Science, Volume 2191, Springer Verlag (2001), 148-154.
[8] K. Mikolajczyk, C. Schmid, Scale and Affine Invariant Interest Point Detectors; in: International Journal of Computer Vision, 60(1):63-86, 2004.
[9] T. Tuytelaars, L. Van Gool, Matching Widely Separated Views Based on Affine Invariant Regions; in: International Journal of Computer Vision, 59(1):61-85, 2004.
[10] J. Matas, O. Chum, M. Urban, T. Pajdla: Robust wide baseline stereo from maximally stable extremal regions; in: British Machine Vision Conference (2002), 384-393.
[11] Timor Kadir, Andrew Zisserman, Michael Brady: An Affine Invariant Salient Region detector; in: 8th European Conference on Computer Vision, Tomas Pajdla, Jiri Matas (Editors), Lecture Notes in Computer Science, Volume 3021, Springer Verlag (2004), 404-416.
[12] Carsten Steger, Markus Ulrich: Hierarchical component based object recognition; U.S. Pat. No. 7,239,929, 2007.
[13] Chris Harris and Mike Stephens. A combined corner and edge detector; in: Proceedings of the 4th Alvey Vision Conference (1988), 147-151.

[14] Cordelia Schmid, Roger Mohr, and Christian Bauckhage. Evaluation of Interest Point Detectors. In: International Journal of Computer Vision, 37(2):151-172, 2000.

[15] Y. Lambdan and H. Wolfson. Geometric Hashing: A General and Efficient Model-based Recognition Scheme; in: 2nd International Conference on Computer Vision (1988), 238-249.

[16] Jun Platanov, Marion Langer: Automatic contour model creation out of polygonal CAD models for markerless Augmented Reality; in: 6th IEEE and ACM International Symposium on Mixed and Augmented Reality, 2007.

[17] Andreas Hofhauser, Carsten Steger, Nassir Navab: Edge-based Template Matching and Tracking for Perspectively Distorted Planar Objects; in: 4th International Symposium on Visual Computing, Las Vegas, Nev., USA, December 2008.

[18] Christian Wiedemann, Markus Ulrich, Carsten Steger: Recognition and Tracking of 3D Objects; in: Pattern Recognition, Gerhard Rigoll (Editor), Lecture Notes in Computer Science, Volume 5096, Springer Verlag (2001), 132-141.

What is claimed is:

1. A method for creating an enhanced CAD, referred to as CV-CAD model, called Computer Vision CAD model wherein the CV-CAD model describes an object consisting of one or more object parts, each object part comprising (i) a standard CAD model, said CAD model comprising information about geometry and, optionally, texture of said object part and (ii) at least one agent, said at least one agent being associated to said object part, said at least one agent comprising necessary information that allows
   (a) to generate an output given an input digital image by considering only said object part, wherein the generated output is the result of the recognition or the detection or the estimation of the pose of said object part, and
   (b) to provide a confidence value of said generated output, and
   (c) to generate the said output independently from any other agent's output, wherein said method comprises the steps of:
   (a1) training for each said object part at least one said agent based on the geometry and, optionally, the surface texture corresponding to said object part to which said agent is associated,
   (b1) training geometric neighborhood relations and visibility information between said at least one agent, and
   (b2) creating the CV-CAD model by storing said CAD models and said corresponding at least one agent of said one or more object parts in one or more digital files, wherein each said agent consists of an executable code or the result of said training or a set of control parameters.

2. The method of claim 1, wherein training said at least one agent for said object part comprises selecting the best fitting at least one computer vision method and the corresponding best set of computer vision features within said object part to enable said output and confidence value computation from said object part.

3. The method of claim 1, wherein said at least one agent in said object part is removable, addable, or replaceable by at least one other agent if said object part is removed, added, or replaced.

4. The method of claim 1, wherein said at least one agent in said object part is selected from any of the following agents: point feature agent, edge-based agent, contour-based agent, color-based agent.

5. A method for using an enhanced CAD, referred to as CV-CAD model, called Computer Vision CAD model, wherein the CV-CAD model describes an object consisting of one or more object parts, each object part comprising (I) a standard CAD model, said CAD model comprising information about geometry and, optionally, texture of said object part and (II) a plurality of agents, said plurality of agents being associated to said object part, said plurality of agents comprising necessary information that allows
   (a) to generate an output given an input digital image by considering only said object part, wherein the generated output is the result of the recognition or the detection or the estimation of the pose of said object part, and
   (b) to provide a confidence value of said generated output, and
   (c) to generate the said output independently from any other agent's output, and
   (d) to provide information about the geometric neighborhood relations and visibility information between said plurality of agents,
   wherein the said method comprises the steps of:
   (e) receiving said CV-CAD model,
   (f) generating one or more executable instances of said plurality of agents for each said part of the object that are stored in said CV-CAD model,
   (g) receiving an image,
   (h) computing the outputs of said object parts described in said CV-CAD model by executing for each said object part its associated said plurality of agents, each of said plurality of agents generates the said output based on said object part independently from any other agent's output,
   (i) computing for each said output said confidence value from said object part and image region.

6. The method of claim 5, wherein said at least one agent in said object part is removable, addable, or replaceable by at least one other agent if said object part is removed, added, or replaced.

7. The method of claim 5, wherein the communication between all said agents leads to the consensus on said output of said object or said object parts and to the conclusion on how said object or said object parts are currently geometrically related to the camera or to other said object parts, leading to an indication of visibility derived from the computed said output and the geometry of said object or said object parts.

8. The method of claim 5, wherein said at least one agent selects the best set of computer vision features within the said local region and the best corresponding computer vision methods to enable said output and confidence value computation from said object part.

9. A system for creating an enhanced CAD, referred to as CV-CAD model, called Computer Vision CAD model, wherein the CV-CAD model describes an object consisting of one or more object parts, each object part comprising (I) a standard CAD model, said CAD model comprising information about geometry and, optionally, texture of said object part and (II) at least one agent, said at least one agent being associated to said object part, said at least one agent comprising necessary information that allows
   (a) to generate an output given an input digital image by considering only said object part, wherein the generated output is the result of the recognition or the detection or the estimation of the pose of said object part, and
   (b) to provide a confidence value of said generated output, and
   (c) to generate the said output independently from any other agent's output, wherein the said system comprises:

(d) means for training for each said object part at least one said agent based on the local geometry and, optionally, the local surface texture corresponding to the local region of said object part to which said agent is associated, (e) means for training geometric neighborhood relations and visibility information between said at least one agent, and (f) means for creating the CV-CAD model by storing said CAD models and said corresponding at least one agent of said one or more object parts in one or more digital files, wherein each said agent consists of an executable code or the result of said training or a set of control parameters.

10. A system for using an enhanced CAD, referred to as CV-CAD model, called Computer Vision CAD model, wherein the CV-CAD model describes an object consisting of one or more object parts, each object part comprising (I) a standard CAD model, said CAD model comprising information about geometry and, optionally, texture of said object part and (II) at least one agent, said at least one agent being associated to said object part, said at least one agent comprising necessary information that allows (a) to generate an output given an input digital image by considering only said object part, wherein the generated output is the result of the recognition or the detection or the estimation of the pose of said object part, and (b) to provide a confidence value of said generated output, and (c) to generate the said output independently from any other agent's output, and (d) to provide information about the geometric neighborhood relations and visibility information between said at least one agent, wherein the said system comprises:

(e) means for receiving said CV-CAD model, (f) means for generating one or more executable instances of said at least one agent for each said part of the object that are stored in said CV-CAD model, (g) means for receiving an image, (h) means for computing the outputs of said object parts described in said CV-CAD model by executing for each said object part its associated said at least one agent, each of said at least one agent generates the said output based on said object part independently from any other agent's output (i) means for computing for each said output said confidence value from said object part and image region.

* * * * *